United States Patent
Hsu et al.

(10) Patent No.: US 6,819,583 B2
(45) Date of Patent: Nov. 16, 2004

(54) FERROELECTRIC RESISTOR NON-VOLATILE MEMORY ARRAY

(75) Inventors: Sheng Teng Hsu, Camas, WA (US); Tingkai Li, Vancouver, WA (US); Fengyan Zhang, Vancouver, WA (US)

(73) Assignee: Sharp Laboratories of America, Inc., Camas, WA (US)

(*) Notice: Subject to any disclaimer, the term of this patent is extended or adjusted under 35 U.S.C. 154(b) by 10 days.

(21) Appl. No.: 10/345,726

(22) Filed: Jan. 15, 2003

(65) Prior Publication Data

US 2004/0136223 A1 Jul. 15, 2004

(51) Int. Cl.[7] ............................................. G11C 11/22
(52) U.S. Cl. ........................ 365/145; 365/148; 365/65
(58) Field of Search ............................... 365/145, 148, 365/65, 117, 118; 257/296

(56) References Cited

U.S. PATENT DOCUMENTS 6,404,668 B2 * 6/2002 Kowarik et al. ............ 365/145
6,627,936 B2 * 9/2003 Ishii ........................... 257/296

OTHER PUBLICATIONS

S. Onishi et al, *A half–micron Ferroelectric Memory Cell Technology with Stacked Capacitor Structure*, IEDM, paper 34.4, p. 843, 1994.

* cited by examiner

*Primary Examiner*—David Lam
(74) *Attorney, Agent, or Firm*—David C. Ripma; Matthew D. Rabdau

(57) ABSTRACT

A ferroelectric thin film resistor memory array is formed on a substrate and includes plural memory cells arranged in an array of rows and columns; wherein each memory cell includes: a FE resistor having a pair of terminals, and a transistor associated with each resistor, wherein each transistor has a gate, a drain and a source, and wherein the drain of each transistor is electrically connected to one terminal of its associated resistor; a word line connected to the gate of each transistor in a row; a programming line connected to each memory cell in a column; and a bit line connected to each memory cell in a column.

19 Claims, 4 Drawing Sheets

FERROELECTRIC RESISTOR NON-VOLATILE MEMORY ARRAY

RELATED APPLICATION

This Application is related to U.S. Pat. No. 6,048,738, granted Apr. 11, 2000, for *Method of Making Ferroelectric Memory Cell for VLSI RAM Array*, and to U.S. patent application Ser. No. 10/305,551, filed Nov. 26, 2002 for *Ferroelectric Resistor Non-volatile Memory*, now abandoned.

FIELD OF THE INVENTION

This invention relates to ferroelectric non-volatile memory arrays, and specifically to a memory array which features a non-destructive read and which functions similarly to a constant current memory device.

BACKGROUND OF THE INVENTION

One-transistor one-ferroelectric capacitor (1T1C) memory cells and single transistor ferroelectric-based devices are used as memory storage devices. Although the 1T1C memory is non-volatile, it is read destructive, i.e., the stored data is lost during a read operation, requiring refreshment of the cell. A read operation in a single transistor memory is non-destructive, however, because there is a relatively large field across the ferroelectric capacitor during standby conditions, there is a significant reduction in memory retention time.

S. Onishi et al, *A half-micron Ferroelectric Memory Cell Technology with Stacked Capacitor Structure*, IEDM, paper 34.4, p. 843, 1994, describes fabrication of a ferroelectric memory cell using dry etching of a PZT/Pt/TiN/Ti structure.

SUMMARY OF THE INVENTION

A ferroelectric thin film resistor memory array is formed on a substrate and includes plural memory cells arranged in an array of rows and columns; wherein each memory cell includes: FE resistor having a pair of terminals, and a transistor associated with each resistor, wherein each transistor has a gate, a drain and a source, and wherein the drain of each transistor is electrically connected to one terminal of its associated resistor; a word line connected to the gate of each transistor in a row; a programming line connected to each memory cell in a column; and a bit line connected to each memory cell in a column. In one embodiment, the programming line is connected to the FE resistor other terminal and the bit line is connected to the transistor source, while in another embodiment, the programming line is connected to the transistor source and the bit line is connected to the FE resistor other terminal. In the latter embodiment, the programming line is suitable for function as a block erase line.

It is an object of the invention to provide a non-destructive read long detention time ferroelectric memory resistor array suitable for embedded as well as stand alone large scale non-volatile memory Another object of the invention is to provide a memory array which function similarly to a constant current array.

This summary and objectives of the invention are provided to enable quick comprehension of the nature of the invention. A more thorough understanding of the invention may be obtained by reference to the following detailed description of the preferred embodiment of the invention in connection with the drawings.

DETAILED DESCRIPTION OF THE PREFERRED EMBODIMENTS

A basic non-volatile non-destructive read memory ferroelectric memory cell suitable for RAM application is disclosed in the related patent and application. The invention hereof is a large scale RAM circuit incorporating the previously disclosed memory cell. The basic circuit structure is similar to that of an 1T1C ferroelectric memory with a modified memory operation circuit.

Figure 1:
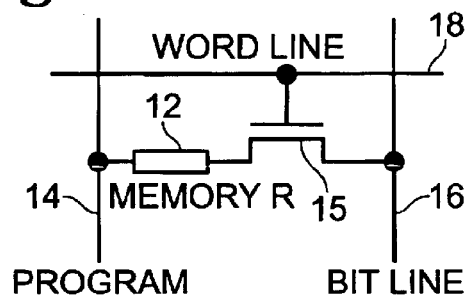
FIG. 1 is a schematic representation of the memory cell of the invention.

The basic cell configuration is shown in FIG. 1, generally at 10. The ferroelectric capacitor of the 1T1C cell is replaced with a memory resistor 12, and the "drive line" is replaced with a "programming line" 14. A transistor 15 includes a gate, a source and a drain, while memory resistor 12 includes a pair of terminals, one of which is connected to the drain of transistor 15. A bit line 16 and a word line 18 are provided. In this embodiment of the array of the invention, word line 18 is connected to transistor 15 gate, bit line 16 is connected to the transistor 15 source, and programming line 14 is connected to the other terminal of memory resistor 12.

Figure 2A:
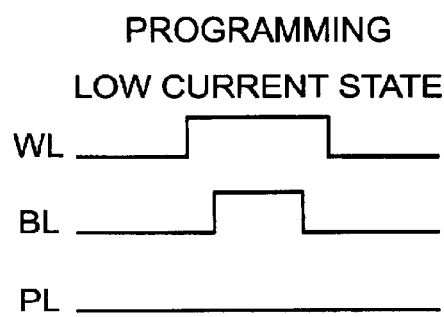
FIG. 2 depicts the programming states of the memory cell of the invention.
Figure 2B:
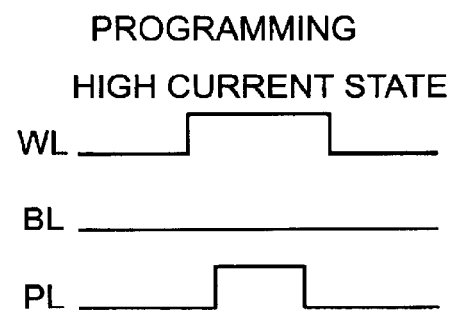
Figure 2C:
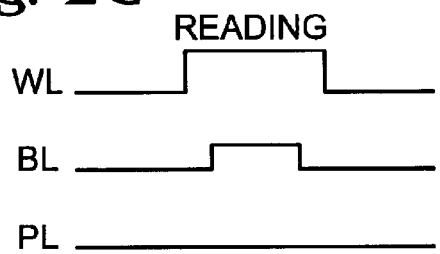
Figure 3:
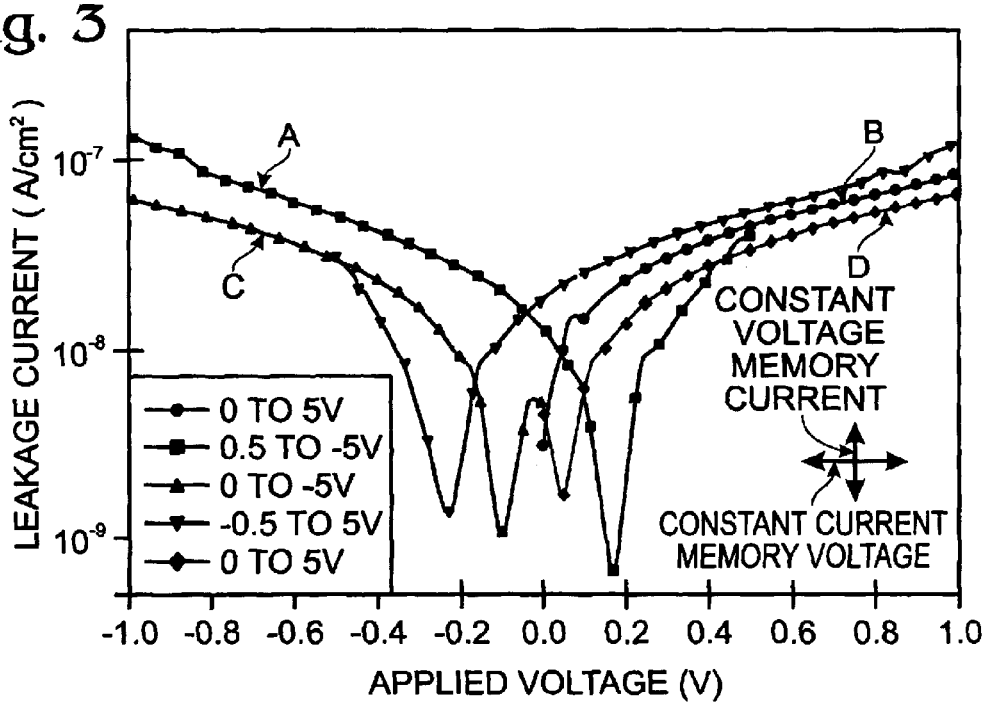
FIG. 3 depicts the I–V characteristics of a PGO resistor.
Figure 4:
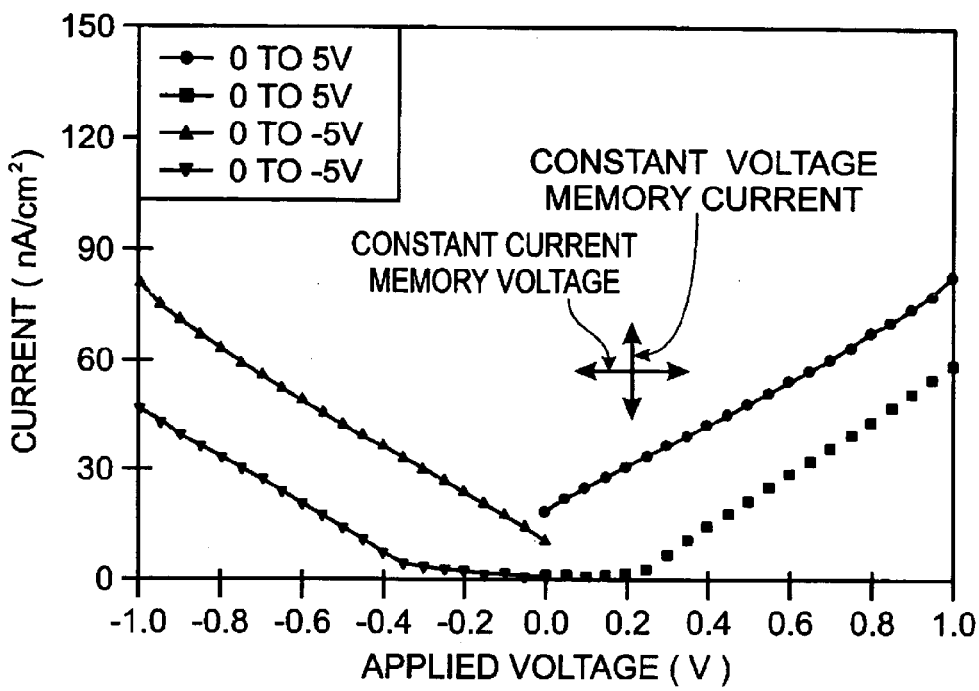
FIG. 4 is a linear scale of device current of the memory cell of the invention.
Figure 5A:
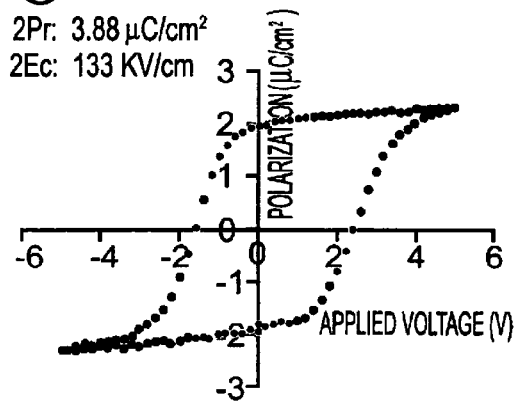
FIG. 5a depicts the hysteresis loop of a PGO memory resistor used in the memory cell of the invention.
Figure 5B:
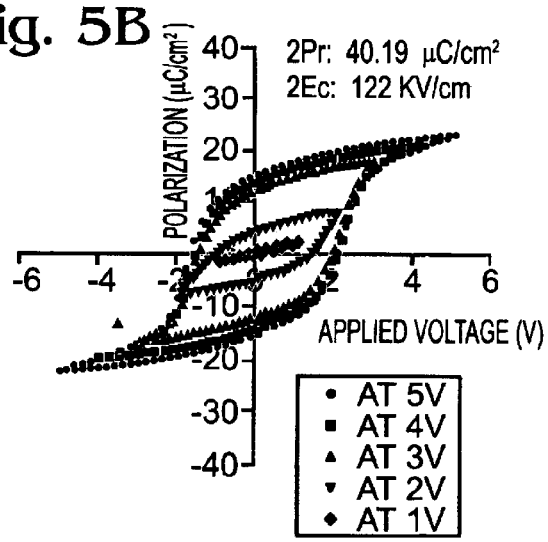
FIG. 5b depicts the hysteresis loop of a PZT memory resistor used in the memory cell of the invention.

The programming and memory reading pulses are depicted in FIG. 2. FIG. 2a depicts a low current state; FIG. 2b depicts a high current state; and FIG. 2c depicts a reading state. The amplitude of the programming pulse is between about 2 V to 5 V, depending on the voltage required for ferroelectric thin film polarization. The read pulse is a constant current pulse of between about 10 nA to 100 nA for the device having the I–V characteristics specifically shown in FIGS. 3 and 4. Again the amplitude and the pulse width is dependent on the actual memory resistor property, principally the ferroelectric properties. The amplitude of the constant current is selected such that the voltage across the memory resistor is lower than the coercive voltage of the device. A ferroelectric resistor exhibiting a well defined coercive voltage is required for the device to have a long memory retention time. FIGS. 5a and 5b depict the hysteresis loops of PGO and PZT thin film resistors, respectively. The PGO hysteresis loop demonstrates a well defined coercive voltage of about 1V, however, there is no well defined coercive voltage for the PZT hysteresis loop.

Figure 6:
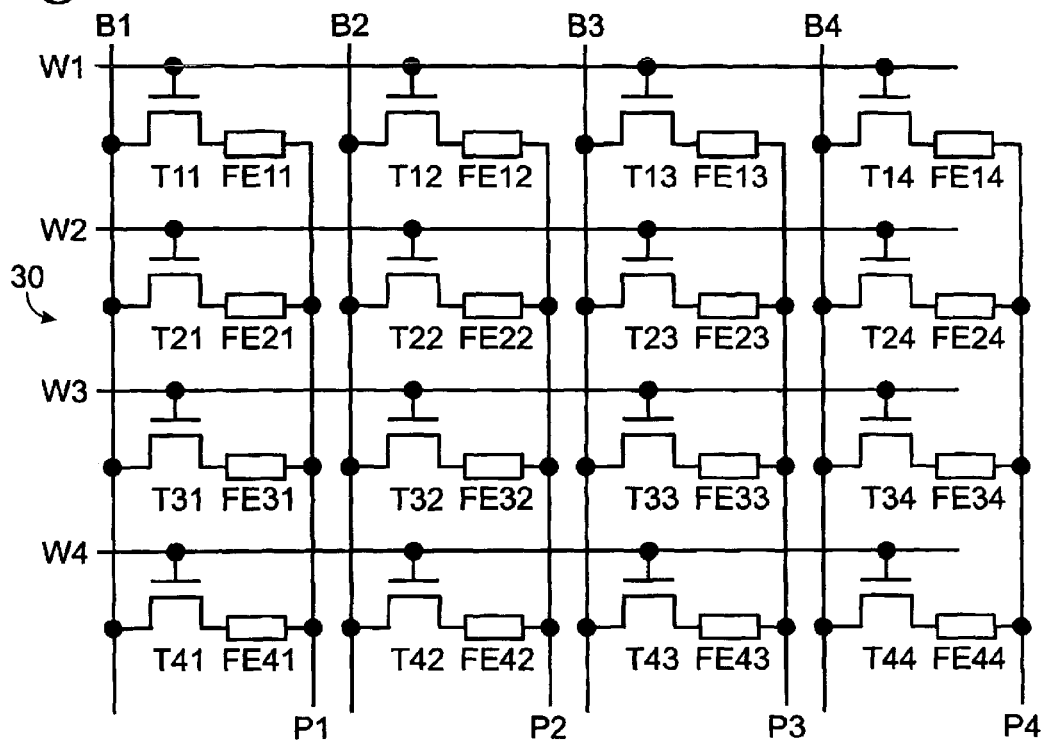
FIG. 6 is a schematic representation of the memory array of the invention.

FIG. 6 depicts a 16-bit equivalent circuit of the array of the invention, generally at 30, where W1–W4 are word lines; B1–B4 are bit lines; and P1–P4 are programming lines. $T_{11}$–$T_{44}$ and $FE_{11}$–$FE_{44}$ are the bit transistors and bit memory resistors, respectively.

EXAMPLE

To write $FE_{22}$ to a high current state, all bit and programming lines are grounded, except P2. A programming pulse, $+V_P$, is applied to W2, which turns on all transistors connected to W2. A programming pulse is applied to P2. Because the resistance of the memory resistor is very high, the voltage drop in transistor $T_{22}$ is very small. The voltage across memory resistor $FE_{22}$ is nearly equal to the amplitude of the programming pulse, $V_P$. All other transistors connected to W2 line are turned on, however, because their programming lines and bit lines are at ground potential, they do not achieve a high current state. Because the gate of all transistors connected to B2, except $T_{22}$, are at the ground potential, only memory resistor $FE_{22}$ is polarized. The memory contents of all other memory resistors are not changed. To block erase the memory array, a programming pulse, $+V_P$, is applied to all P-lines and W-lines, while all B-lines are grounded. This programs all memory resistors to a high current state.

To write $FE_{22}$ to low current state, all bit and programming lines are grounded, except B2. A programming pulse, $+V_P$, is applied to W2, which turns on all transistors connected to W2. A programming pulse, $+V_P$, is applied to B2. Because the resistance of the memory resistor is very high, the voltage drop in transistor $T_{22}$ is very small. The voltage across the memory resistor, $FE_{22}$, is nearly equal to the amplitude of the programming pulse, $+V_P$. All other transistors connected to W2 line are turned on, however, because the associated programming lines and bit lines are at ground potential, the remaining W2 transistors do not drop to their low current states. Because the gates of all transistors connected to B2, except $T_{22}$, are at the ground potential, only memory resistor $FE_{22}$ is polarized. The memory contents of all other memory resistors are not changed.

The above process may be applied to program any memory bit in the array. To read the memory contents of $FE_{33}$, all word lines, bit lines, and programming lines are grounded, except W3 and B3. An operation voltage, $V_{CC}$, is applied to W3 and a constant current of between about 10 $\mu$A to 100 $\mu$A is applied to B3. Bit line B3 is also connected to a sense amplifier to measure the voltage across the memory resistor.

Memory sensing is now described in more detail. The voltage detected at the sense amplifier is the sum of the voltages across the memory resistor and that across the bit transistor. Because the voltage across the memory resistor is less than the coercive voltage of the ferroelectric thin film, the detected voltage is less than 1V. The word line voltage is equal to the circuit operating voltage, $V_{CC}$. Therefore, the bit transistor operates in the linear, or triode, region.

$$I_D = K(V_G - V_{TH} - V_S - \tfrac{1}{2}V_{TR})V_{TR} \qquad (1)$$

Where $V_G$ is the word line voltage, $V_{TH}$ is the threshold voltage of the transistor, $V_S$ is the voltage at the source of the transistor, and $V_{TR}$ is the voltage drop across the transistor. Differentiation of Eq. (1) with respect to $V_S$, yields:

$$\frac{dI_D}{dV_S} = K(V_G - V_{TH} - V_S - V_{TR})\frac{dV_{TH}}{dV_S} - KV_{TR} = 0 \qquad (2)$$

Therefore, $$\frac{dV_{TR}}{dV_S} = \frac{V_{TR}}{V_G - V_{TH} - V_S - V_{TR}} > 0 \qquad (3)$$

Eq. (3) implies that $V_{TR}$ increases as $V_S$ increases, therefore, the voltage across the bit transistor enhances the memory voltage window.

Figure 7:
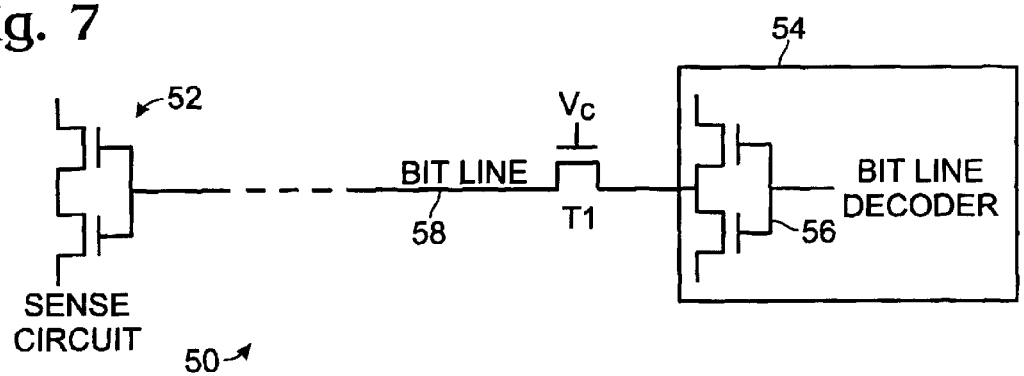
FIG. 7 is a schematic of a portion of the memory array of FIG. 6.

Referring to FIG. 7, a schematic of a portion of the array is depicted generally at 50, and includes a sensing circuit 52, a bit line decoder 54, and a transistor T1. A bit line drive voltage source may be a simple MOST 56, preferably a pMOST, connected in series to the output of a bit line 58 of decoder 54. For programming, the gate voltage of T1 is biased to $V_P$. For reading operations the gate voltage of T1 is biased to deliver a given constant current of between about 10 $\mu$A to 100 $\mu$A. The low memory voltage is selected to be lower than the threshold voltage of the output inverter, while the high memory voltage state is higher than the turn-on voltage of the output inverter. The output of the memory is able to switch the sense inverter without an additional sense amplifier. The array may be block erased by applying the erase voltage to all programming lines and all word lines, while simultaneously grounding all bit lines.

While the array of the invention may be used for constant voltage operation, it is not a true constant voltage array. To use the array for constant voltage operations, the bit line voltage is set to be lower than 0.5V to-prevent read errors. The bit output is measured by connecting a current sensing amplifier at the programming line.

Figure 8:
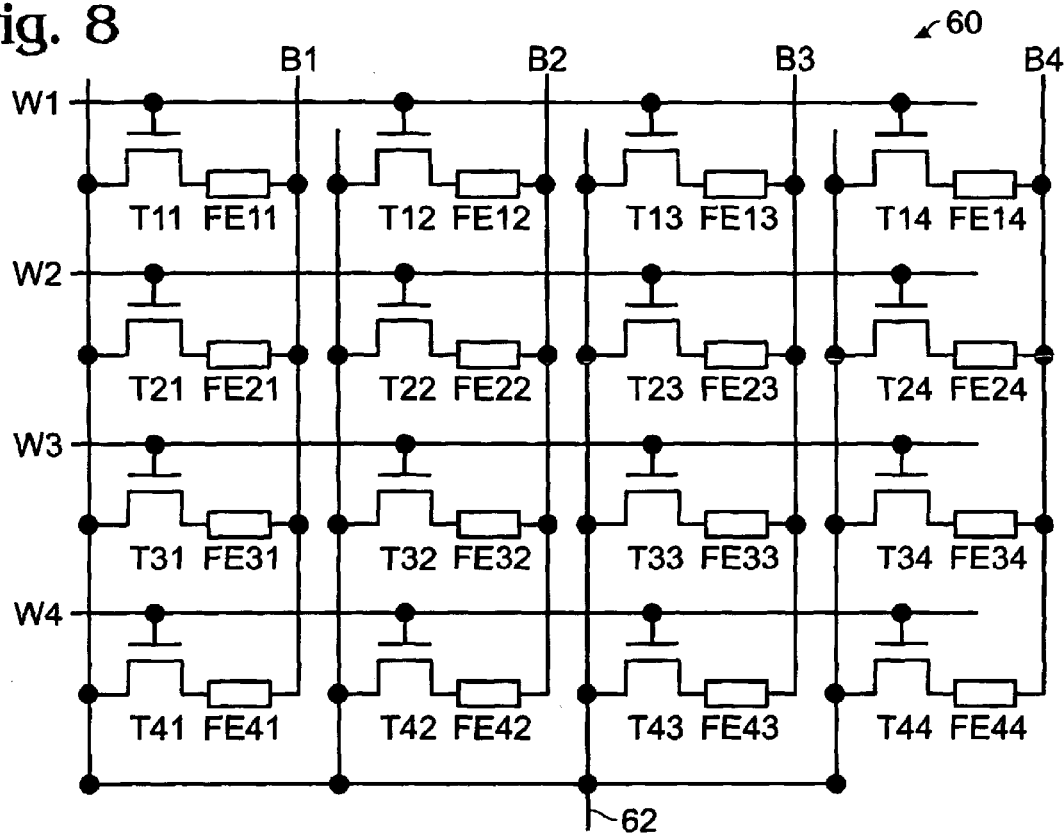
FIG. 8 is a schematic representation of an alternate embodiment of the memory array of the invention.

While the array of FIG. 6 provides high-speed programming when setting the memory resistor to its high-current state, because the programming line of FIG. 6 is biased with a positive voltage and the memory resistor is connected to the drain of the bit transistor, it has a relative slower speed when setting the memory resistor to it low current state, because, as $+V_P$ is applied to the bit line, the memory cell operates as a source follower, resulting in a slower programming speed to the low current state. This does not have a large impact on operating speed when the memory array is programmed one bit at a time, however, total programming time may be much greater for a block erase operation, wherein a block of memory is erased to the high current state, followed by programming of individual cells to the low current state. In the case where it is desirable to provide a high-speed block erase, for applications which are frequently used in block erase operations, the embodiment of the memory array depicted in FIG. 8, generally at 60, is suitable. In array 60, the transistor drain is connected to memory resistor one terminal, word lines are still connected to the gates of the transistors in each cell, however, the bit lines are connected to the FE resistor other terminal, and a programming line 62, also referred to herein as a block erase line, is connected to the source of the transistors in the array.

Thus, a ferroelectric resistor non-volatile memory array has been disclosed. It will be appreciated that further variations and modifications thereof may be made within the scope of the invention as defined in the appended claims.

We claim:

1. A ferroelectric thin film resistor memory array formed on a substrate comprising:
   plural memory cells arranged in an array of rows and columns; wherein each memory cell includes:
   FE resistor having a pair of terminals, and
   a transistor associated with each resistor, wherein each transistor has a gate, a drain and a source, and wherein said drain of each transistor is electrically connected to one terminal of its associated resistor;
   a word line connected to the gate of each transistor in a row;
   a programming line connected to each memory cell in a column; and
   a bit line connected to each memory cell in a column;
   wherein, said memory cells are programmed using a programming voltage; and wherein the ferroelectric resistor is non-destructively read by sensing taken from the group of sensing consisting of constant voltage sensing and constant current sensing.

2. The array of claim 1 wherein said FE resistor is constructed and arranged to provide a constant current reading at a voltage of between about zero volts and 1+ volts.

3. The array of claim 3 wherein said FE resistor is constructed and arranged to provide a constant voltage reading at a voltage less than 0.5V.

4. The array of claim 3 wherein said FE resistor is constructed and arranged to provide a constant voltage reading at a voltage less than 0.2V.

5. The array of claim 3 wherein said FE resistor is constructed and arranged to provide a programming voltage in a range of between about 2 V and 5 V.

6. The array of claim 1 wherein said programming line is connected to said FE resistor other terminal and wherein said bit line is connected to said transistor source.

7. The array of claim 1 wherein said programming line is connected to said transistor source and wherein said bit line is connected to said FE resistor other terminal.

8. The array of claim 7 wherein said programming line is a block erase line.

9. A ferroelectric thin film resistor memory array formed on a substrate comprising:
  plural memory cells arranged in an array of rows and columns; wherein each memory cell includes:
    FE resistor having a pair of terminals, and
    a transistor associated with each resistor, wherein each transistor has a gate, a drain and a source, and wherein said drain of each transistor is electrically connected to one terminal of its associated resistor;
  a word line connected to the gate of each transistor in a row;
  a programming line connected to each memory cell in a column; and
  a bit line connected to each memory cell in a column;
  wherein said FE resistor is constructed and arranged to provide a constant current reading at a voltage of between about zero volts and 1+ volts to provide a programming voltage in a range of between about 2 V and 5 V.

10. The array of claim 9 wherein said programming line is connected to said FE resistor other terminal and wherein said bit line is connected to said transistor source.

11. The array of claim 9 wherein said programming line is connected to said transistor source and wherein said bit line is connected to said FE resistor other terminal.

12. The array of claim 11 wherein said programming line is a block erase line.

13. The array of claim 9 wherein said FE resistor is constructed and arranged to provide a constant voltage reading at a voltage less than 0.5V.

14. The array of claim 13 wherein said FE resistor is constructed and arranged to provide a constant voltage reading at a voltage less than 0.2V.

15. A ferroelectric thin film resistor memory array formed on a substrate comprising:
  plural memory cells arranged in an array of rows and columns; wherein each memory cell includes:
    FE resistor having a pair of terminals, and
    a transistor associated with each resistor, wherein each transistor has a gate, a drain and a source, and wherein said drain of each transistor is electrically connected to one terminal of its associated resistor;
  a word line connected to the gate of each transistor in a row;
  a programming line connected to each memory cell in a column, and is further connected to said transistor source; and
  a bit line connected to each memory cell in a column and is further connected to said FE resistor other terminal.

16. The array of claim 15 wherein said programming line is connected to said FE resistor other terminal and wherein said bit line is connected to said transistor source.

17. The array of claim 15 wherein said FE resistor is constructed and arranged to provide a constant current reading at a voltage of between about zero volts and 1+ volts.

18. The array of claim 17 wherein said FE resistor is constructed and arranged to provide a programming voltage in a range of between about 2 V and 5 V.

19. The array of claim 15 wherein, said memory cells are programmed using a programming voltage; and wherein the ferroelectric resistor is non-destructively read by sensing taken from the group of sensing consisting of constant voltage sensing and constant current sensing.

* * * * *